United States Patent [19]

Hanafusa et al.

[11] Patent Number: 4,833,100

[45] Date of Patent: May 23, 1989

[54] METHOD FOR PRODUCING A SILICON THIN FILM BY MBE USING SILICON BEAM PRECLEANING

[75] Inventors: Hiroshi Hanafusa; Kiyoshi Yoneda, both of Hirakata; Hidenori Ogata, Osaka, all of Japan

[73] Assignee: Kozo Iizuka, Director-General of Agency of Industrial Science and Technology, Tokyo, Japan

[21] Appl. No.: 939,101

[22] Filed: Dec. 8, 1986

[30] Foreign Application Priority Data

Dec. 12, 1985 [JP] Japan ................... 60-278005
May 2, 1986 [JP] Japan ................... 61-101037

[51] Int. Cl.⁴ ............... H01L 21/203; H01L 21/205
[52] U.S. Cl. ........................... 437/85; 148/DIG. 17;
148/DIG. 25; 148/DIG. 169; 156/612;
437/106; 437/108; 437/112; 437/946; 437/939
[58] Field of Search ........... 29/576 E; 148/1.5, 175,
148/DIG. 25, 60, 17, 46, 48, 128, 169;
156/610–614; 427/38, 41, 95; 437/85, 105, 106,
107, 108, 112, 946, 939

[56] References Cited

U.S. PATENT DOCUMENTS

| | | | |
|---|---|---|---|
| 3,615,931 | 10/1971 | Arthur, Jr. | 148/175 |
| 3,765,940 | 10/1973 | Hentzsche | 148/DIG. 169 |
| 3,816,197 | 6/1974 | Neale | 148/DIG. 17 |
| 3,915,765 | 10/1975 | Cho et al. | 148/175 |
| 3,949,119 | 4/1976 | Shewchun et al. | 148/174 |
| 3,969,164 | 7/1976 | Cho et al. | 148/175 |
| 4,477,311 | 10/1984 | Mimura et al. | 148/DIG. 17 |

FOREIGN PATENT DOCUMENTS

| | | | |
|---|---|---|---|
| 0147123 | 8/1985 | Japan | 148/DIG. 17 |
| 0145626 | 8/1985 | Japan | 148/DIG. 17 |

OTHER PUBLICATIONS

Bean, "Growth of Silicon Films on Sapphire and Spinel by Molecular Beam Epitaxy", Appl. Phys. Lett., vol. 36, No. 9, 1 May 1980, pp. 741–743.
Allen, "What Can Molecular Beam Epitaxy Do for Silicon Devices?", Thin Solid Films, 123 (1985), pp. 273–279.
Stall, "Growth of Refractory Oxides Films . . . Molecular Beam Epitaxy . . . ", J. Vac. Sci, Technol. B 1(2), Apr.–Jun. 1983, pp. 135–137.
Ghandi, "VLSI Fabrication Principles", John Wiley & Sons, New York, NY, 4/5/1983, pp. 215, 216, 281–283.

Primary Examiner—Brian E. Hearn
Assistant Examiner—William Bunch
Attorney, Agent, or Firm—Wenderoth, Lind & Ponack

[57] ABSTRACT

The present invention relates to a method for producing a semiconductor thin film, in which a single crystalline silicon film is grown on an insulative single crystalline substrate, such as a single crystalline sapphire substrate, by the molecular beam epitaxy method. Silicon molecular beams are irradiated onto the substrate under the conditions wherein a substrate temperature is kept at 700° to 900° C. and an intensity of the molecular beams is kept within a range from $1 \times 10^{12}$ atoms/cm²·sec to $1 \times 10^{13}$ atoms/cm²·sec to clean a surface of the substrate and then the intensity of the molecular beams is increased to form the single crystalline silicon film. Thus, the substrate can be cleaned without being defected.

5 Claims, 9 Drawing Sheets

METHOD FOR PRODUCING A SILICON THIN FILM BY MBE USING SILICON BEAM PRECLEANING

BACKGROUND OF THE INVENTION

1. Field of the Invention

The present invention relates to a method for epitaxially growing a single crystalline silicon thin film on a single crystalline insulating substance such as a single crystalline sapphire substrate and a single crystalline spinel film.

2. Description of the Prior Art

In general, the SOS (Silicon on Sapphire) techology has been used as a method for achieving the high integration, high-speed and reduction of electric power consumption of an integrated circuit. This is a method for epitaxially growing a single crystalline silicon film on a single crystalline sapphire substrate. This SOS technology has adantages in that, for example, the separation of elements which are integrally formed in an epitaxial film can be easily carried out by etching and the like, and the problem of latch-up incidental to an integrated circuit on a usual silicon substrate can be prevented.

The vapor-phase growth method by the thermal decomposition of monosilane ($SiH_4$) has been frequently used for epitaxially growing a single crystalline silicon film on a single crystalline sapphire substrate. However, this vaporphase growth method has shown disadvantages in that the growing temperature is high to an extent of 950° C. or more the there is a great difference of thermal expansion coefficient between sapphire and silicon, so that crystal defects are introduced into the epitaxial film of grown single crystalling silicon to increase a defect-density and aluminum atoms and oxygen atoms of the sapphire substrate are autodiffused into the epitaxial silicon film, whereby a highquality epitaxial silicon film is difficult to obtain. Accordingly, a semiconductor device formed in an epitaxial single crystalline silicon film formed by such vapor-phase growth method has shown a disadvantage in that sufficiently satisfactory characteristics can not be achieved. In view of such problems, the epitaxial single crystalline silicon film has been intended to grow at lower temperature. Such low-temperature growing method includes the low-pressure vapor-phase growth method and the molecular beam epitaxy method (MBE method). A method of producing a SOS film by the MBE method, by which the above described disadvantages can be eliminated, has been reported by Dr. J. C. Bean of the Bell Laboratory in Applied Physics Letters 36 (9), 1 May, 1980, p. 741–743 as one example of the latter.

In this report a method for obtaining the SOS structure, in which a sapphire substrate with a (1102) plane chemico-mechanically mirror-finished as a main plane is spattered with argon ions ($Ar^+$) at a temperature thereof of 1,000° C. in a superhigh vacuum of $10^{-11}$ Torr or subjected to the flash annealing for a short time at high temperature thereof of 1,400° C. to clean a surface thereof and then the sapphire substrate is subjected to the MBE with keeping lower temperature thereof ranging from 600° to 850° C. to epitaxially grow a single crystalline silicon film, has been reported.

However, this method has the following three problems:

Since the sapphire substrate is heated at high temperature of 1,000° C. or more when it is cleaned, (1) Defects, such as a warp and slip lines, are apt to be produced at the sapphire substrate.

(2) There is the possibility that the degree of vacuum is reduced by a gas generated from a wall surface of the growing chamber, a heater or jigs of the sapphire substrate, and simultaneously, the sapphire substrate is recontaminated with such a gas generated. This leads to the deterioration of the epitaxially grown single crystalline silicon film in quality together with the problem (1).

(3) measures for improving the heat-resistance and the durability of the jigs of the substrate and the like become necessary, whereby the apparatus becomes complicated and expensive.

SUMMARY OF THE INVENTION

It is a first object of the present invention to provide a method for producing a semiconductor thin film capable of growing the thin film at temperature lower than those in the prior art, solving the above described three problems in a single stroke, and obtaining the film superior in crystallinity.

That is to say, according to the present invention, the subsequent growth of the thin film can be carried out at about similar temperature by performing beforehand a process in which silicon molecular beams are irradiated upon a single crystalline insulating substance, such as a sapphire substrate, at a temperature ranging from 700° to 900° C. to clean a surface of said single crystalline insulating substance. This growth of the thin film at lower temperature can prevent the defects, such as a warp and slip line, from being generated in the single crystalline insulating substance, prevent the surface of the single crystalline insulating substance from being recontaminated with a gas generated from the wall of the growing chamber, and reduce the measures needed for giving heat-resistance to the manufacturing apparatus.

It is a second object of the present invention to provide a method for producing a semiconductor thin film in which the thin film is adapted to epitaxially grow subsequent to the above described cleaning process to obtain a high-quality thin film within a short time and no additional expense is required for the manufacturing apparatus for carrying out the method.

The above and further objects and features of the invention will more fully be apparent from the following detailed description with accompanying drawings.

DETAILED DESCRIPTION OF THE PREFERRED EMBODIMENT

The present invention is described below in detail with reference to the drawings showing one preferred embodiment thereof.

Figure 1A:
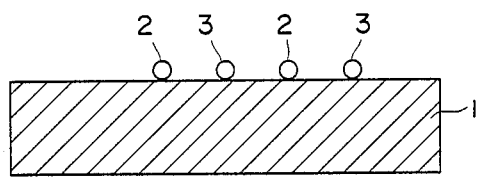
FIG. 1 is a sectional structural drawing of a substrate showing a producing process of the present invention.

At first, as shown in FIG. 1(a), a sapphire single crystalline ($Al_2O_3$) substrate 1 with a (1012) plane chemicomechanically mirror-finished as a main plane is degreased with organic solvents and washed and then subjected to a boiling treatment in a ($NH_4OH+H_2O_2$) solution. Subsequently, the substrate 1 is subjected to a boiling treatment in a ($HCl+H_2O_2$) solution and then washed with pure water followed by drying. Further said subsequently, the substrate 1 is placed in a growing chamber (not shown) of a molecular beam epitaxial growing apparatus (hereinafter referred to as a MBE apparatus) kept under the superhigh vacuum of $1 \times 10^{-11}$ Torr.

At this time, as shown in FIG. 1(a), contaminants, such as oxygen atoms 2 and carbon atoms 3, adhered to the surface of the substrate 1 during the carriage of the substrate 1 to the growing chamber.

Figure 2A:
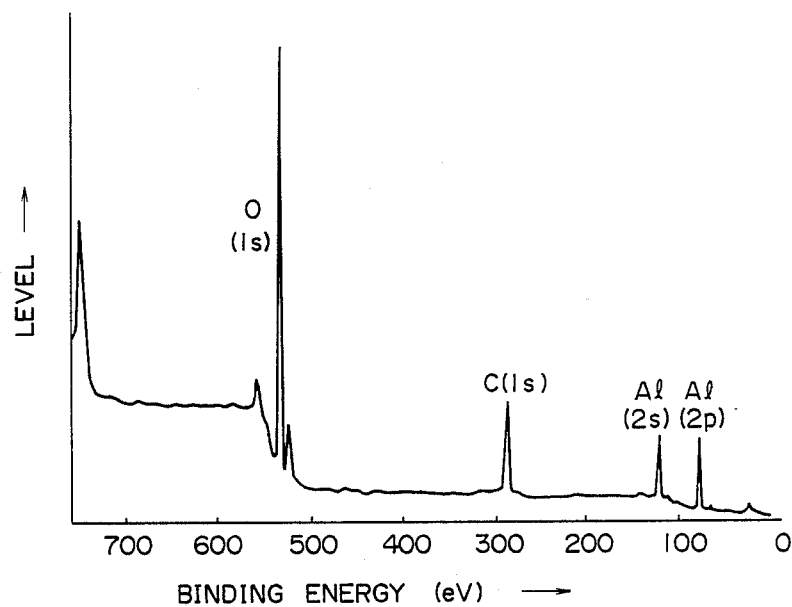
FIG. 2 is a graph of an X-ray photoelectron emission spectroscopy of a single crystalline sapphire substrate.
Figure 2B:
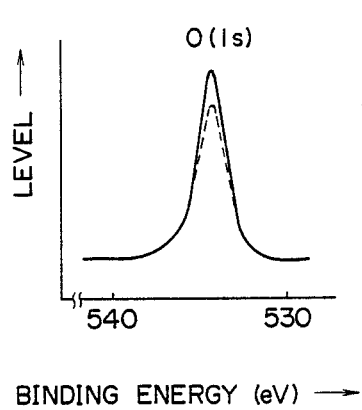
Figure 2C:
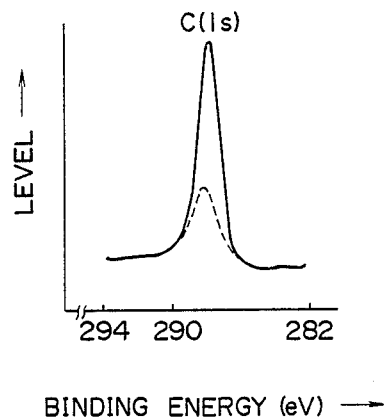

It is found from the investigation of the surface of the substrate 1 after said washing-drying treatment by the X-ray Photoelectron emission Spectroscopy (XPS) that peaks are seen corresponding to the existence of oxygen atoms [O], carbon atoms [C] and aluminum atoms [Al] on the surface of the substrate 1, as shown in FIG. 2 (a). It is found that upon subjecting the surface of the substrate 1 to the spatter-etching treatment by, for example, argon ions ($Ar^+$), both the peak levels of [O] and of [C] are reduced as shown by broken lines in FIG. 2(b) and (c), while a large amount of contaminants, such as [O] and [C], are adhered to the surface of the substrate 1 after only the chemical treatment.

In FIG. 2, an axis of abscissa shows a binding energy, an axis of ordinate showing a relative level, [O] (1s) showing an energy level of [O], [C] (1s) showing an energy level of [C], and [Al] (2s) and [Al] (2p) showing energy levels of aluminum atoms. In addition, FIG. 2(b), (c) are enlarged vicinities of the peak of the spectrum of [O] (1s) and [C] (1s) in FIG. 2(a), respectively.

Figure 1B:
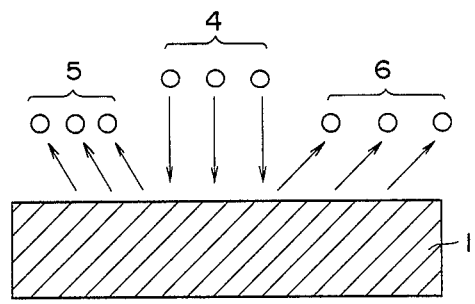

Next, the inside of the growing chamber of the MBE apparatus is kept under the superhigh vacuous condition of $1 \times 10^{-11}$ Torr and then the substrate 1 is heated and kept at 750° C. Subsequently, electron beams are irradiated upon silicon housed in a vaporization source cell of the MBE apparatus to vaporize silicon, whereby generating silicon molecular beams. When the silicon molecular beams are irradiated upon the substrate 1, the coming silicon (Si) atoms 4 act on the sapphire ($Al_2O_3$) substrate 1 by a chemical reaction as shown by the following chemical equation, as shown in FIG. 1(b).

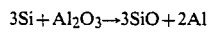

Figure 1C:
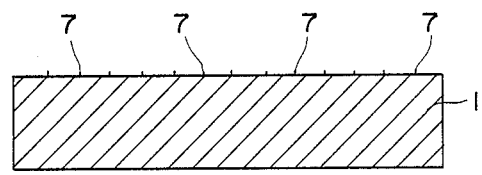

Since silicon oxide (SiO) molecules 5 and aluminum (Al) atoms 6, which are reaction products, are vaporized at a temperature of the substrate 1, also the oxygen atoms 2 and the carbon atoms 3 adsorbed on the surface of the substrate 1 are vaporized at the same time as the vaporization of the SiO molecules 5 and aluminum atoms 6 from the surface of the substrate 1 to etch and clean the surface of the substrate 1 with silicon molecular beams, as shown in FIG. 1(c).

If the silicon molecular beams to be irradiated are too strong, silicon atoms are accumulated on the surface of the substrate 1 prior to the etching of the surface of the substrate 1, so it is necessary to adjust the intensity of the silicon molecular beams to be irradiated according to the temperature of the substrate 1.

Figure 1D:
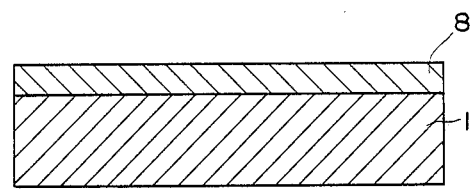

And, after the surface of the substrate 1 has been cleaned by the irradiation of silicon molecular beams, bonds 7 of ($Al_2O_3$) appear on the surface of the substrate 1, as shown in FIG. 1(c). Silicon is combined with the bonds 7 to stabilize them and silicon is accumulated, thereby forming a single crystalline silicon film 8, as shown in FIG. 1(d). As a result, the SOS structure is formed. At this time, the intensity of silicon molecular beams for accumulating silicon should be set so as to be higher than that of silicon molecular beams required for the etching reaction shown by the equation.

Next, the influence of the cleaning of the surface of the substrate 1 by the irradiation of the silicon molecular beams upon the crystallinity of the silicon film 8 epitaxially grown on the substrate 1 was investigated.

Figure 3A:
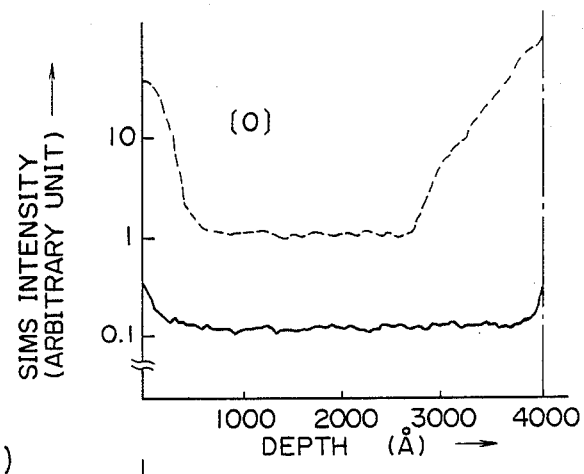
FIG. 3 is an atom-concentration distribution diagram showing the concentrations of oxygen atoms, carbon atoms and aluminium atoms in a silicon film determined by the secondary ion mass spectroscopy.
Figure 3B:
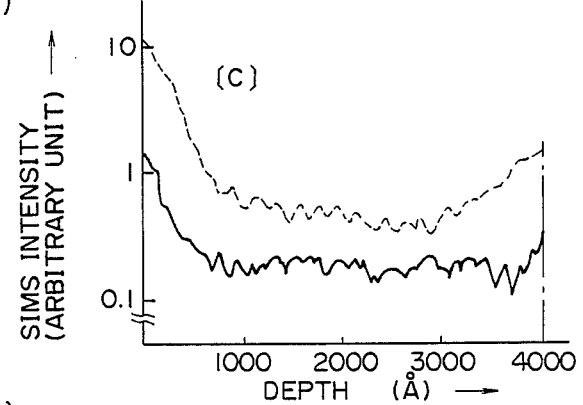
Figure 3C:
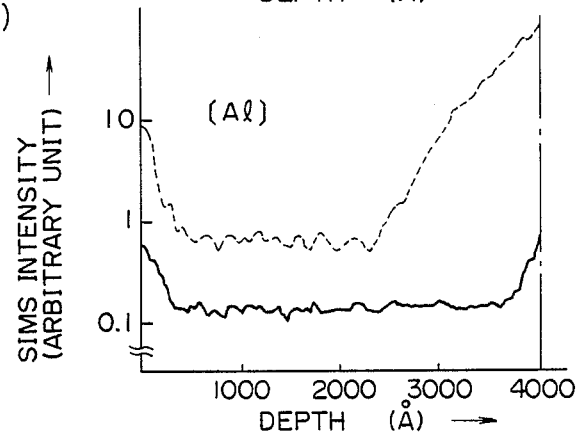

The case, where silicon molecular beams having the intensity of $2 \times 10^{13}$ atoms/cm$^2$·sec are irradiated upon the surface of the substrate 1 with keeping the temperature of the surface of the substrate 1 at 800° C. to clean the surface of the substrate 1 and then the temperature of the substrate 1 is lowered to 750° C. and the silicon film 8 having a thickness of 4,000 Å is formed under the conditions that the growing speed is 4 Å/sec and the degree of vacuum is $3 \times 10^{-9}$ Torr, is compared with the case, where the silicon film is formed under the above described conditions without cleaning the substrate 1, with atom-concentration distributions of oxygen atoms, carbon atoms and aluminum atoms in the direction of depth from the surface of the growing silicon film investigated by the Secondary Ion Mass Spectroscopy (SIMS) to be shown in FIG. 3(a), (b), (c), respectively. In FIG. 3, a solid line shows the case, where the surface of the substrate is subjected to the cleaning treatment, while a broken line shows the case where the surface of the substrate is not subjected to the cleaning treatment.

It is found from the broken lines shown in FIG. 3(a), (b), (c) that is the case, where the surface of the substrate is not subjected to the cleaning treatment, a large amount of oxygen atoms, carbon atoms and aluminum atoms are distributed in the vicinity of the boundary surface between the silicon film formed at a depth of about 4,000 Å from the surface of the silicon film 8.

On the other hand, in the case where the surface of the substrate is subjected to the cleaning treatment, the concentration of oxygen atoms, carbon atoms and aluminum atoms in the vicinity of the boundary surface between the silicon film and the substrate is low an only a slight amount of oxygen atoms, carbon atoms and the aluminum atoms are spread in the silicon film, as shown in FIG. 3(a), (b), (c) by full lines. Accordingly, it is found from the data of the distribution of the concentration of oxygen atoms, carbon atoms and aluminum atoms obtained by the SIMS that the irradiation of silicon molecular beams upon the surface of the substrate leads to the removal of oxygen atoms, carbon atoms and aluminum atoms adsorbed on the surface of the substrate and the cleaning of the surface of the substrate.

Figure 4:
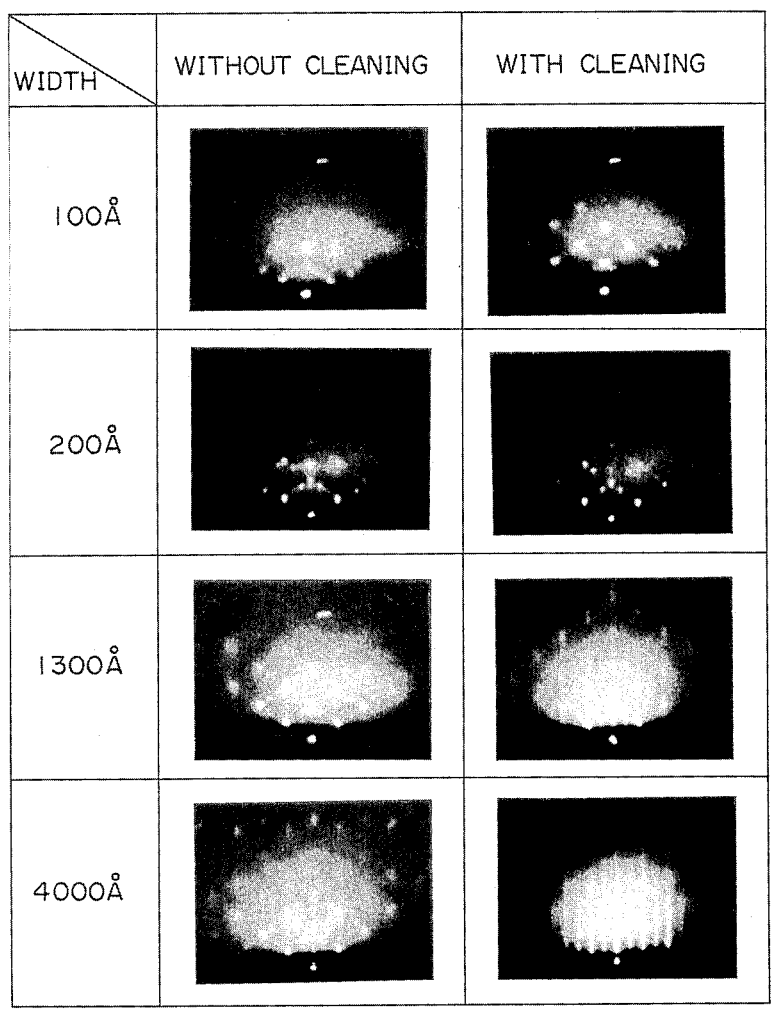
FIG. 4 is an electron beam diffraction pattern photograph showing a surface crystalline structure of the silicon film.
Figure 5:
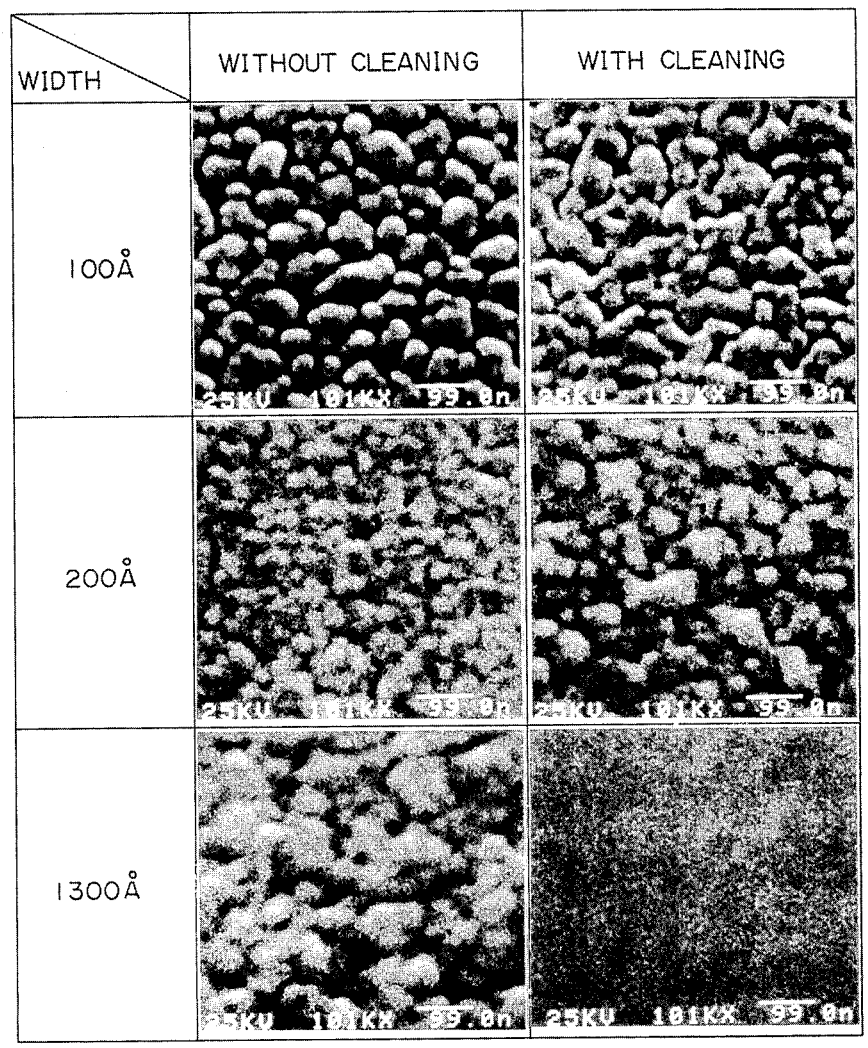
FIG. 5 is an electron microscopic photograph showing a surface state of the silicon film.

Next, the case, where the substrate is subjected to the cleaning under the same conditions as shown in FIG. 3 and then the silicon film is grown under the same conditions as in the case where the atomic concentration distribution as shown in FIG. 3 was obtained, is compared with the case, where the silicon film is grown without cleaning, with surface crystalline structures of each silicon film shown by photographs of FIG. 4 taken by the Reflection High Energy Electron Diffraction (RHEED) pattern at each film thickness of each silicon film and electron microscopic photographs showing the surface states of each silicon film shown in FIG. 5 taken by the Scanning Electron Microscope (SEM).

It is found from FIG. 4 that the RHEED pattern of the silicon film grown on the substrate, which has been subjected to the cleaning treatment, is a spot pattern containing a twin crystal at the first stage where the film thickness of the silicon film is 100 Å while the RHEED pattern of the silicon film grown on the substrate, which has not been subjected to the cleaning treatment, is a spot and ring pattern in which single crystals and polycrystals are mixed, and at a film thickness of the silicon film of 200 Å, a streak pattern showing that the single crystallization makes progress in the case where the substrate has been subjected to the cleaning treatment begins to appear while the ring pattern slightly remains and polycrystals are mixed in the case where the substrate has not been subjected to the cleaning treatment.

It is found from FIG. 4 also that when the growth of the silicon film malkes progress until the film thickness is 1,300 Å and further 4,000 Å, the RHEED pattern of the silicon film grown on the substrate, which has been subjected to the cleaning treatment, becomes a streak pattern and also the streak is intensified with an increase of film thickness, which shows the growth of the single crystalline silicon film superior in crystallinity, while the RHEED pattern of the silicon film grown on the substrate, which has not been subjected to the cleaning treatment, becomes a spot pattern containing a twin crystal at a film thickness of 1,300 Å and the spot pattern containing a twin crystal is still remained even at a film thickness of 4,000 Å even though the streak is observe, that is to say the silicon film grown on the substrate, which has not been subjected to the cleaning treatment, is inferior to the silicon film grown on the substrate, which has been subjected to the cleaning treatment, in crystallinity.

In addition, it is found from FIG. 5 that at the first stage of the growth of the silicon film, where a film thickness of the silicon film is 100 Å, the surface of the silicon film grown on the substrate, which has been subjected to the cleaning treatment, shows a square mosaic structure of the single crystals having the orientation of growth by an electron microscopic photograph while the silicon film grown on the substrate, which has not been subjected to the cleaning treatment, shows a surface state of convex and nearly circular island structure, that is to say isotropic polycrystals are formed. It is found from FIG. 5 also that at a film thickness of 200 Å a mosaic pattern disappears and a flat pattern is being formed in the case where the substrate has been subjected to the cleaning treatment, while the island structure disappears but an uneven structure remains in the case where the substrate has not been subjected to the cleaning treatment and when the growth of the silicon film makes further progress until a film thickness is 1,300 Å, the surface of the silicon film grown on the substrate, which has been subjected to the cleaning treatment, becomes flat, that is to say it is remarkably superior in crystallinity, while the surface of the silicon film grown on the substrate, which has not been subjected to the cleaning treatment, becomes a rough surface having an unevenness to some extent, that is to say it is inferior in crystallinity.

As obvious from FIGS. 4, 5, the cleaning treatment of the surface of the substrate by irradiating silicon molecular beams is a very important process for the production of a high-quality single crystalline silicon film superior in crystallinity.

Next, the optimum conditions of the intensity of silicon molecular beams and the substrate temperature for the cleaning treatment of the surface of the substrate by irradiating silicon molecular beams for the production of the high-quality single crystalline silicon film superior in crystallinity are described.

Figure 6:
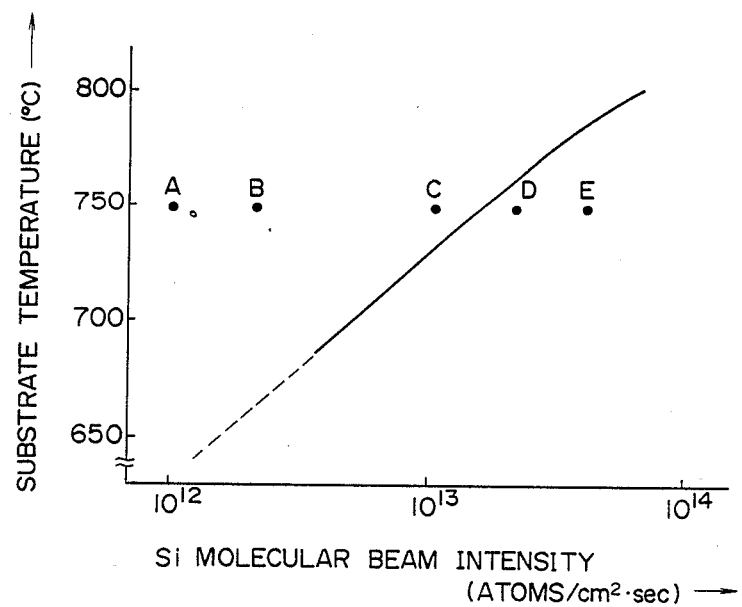
FIG. 6 is a graph showing a relation between a Si molecular beam intensity and a substrate temperature.

At first, as shown in FIG. 6, the intensity of the silicon molecular beams is set at the following value with keeping the substrate temperature at 750° C.:

A: $1 \times 10^{12}$ atoms/cm$^2$·sec
B: $2 \times 10^{12}$ atoms/cm$^2$·sec
C: $1 \times 10^{13}$ atoms/cm$^2$·sec
D: $2 \times 10^{13}$ atoms/cm$^2$·sec
E: $4 \times 10^{13}$ atoms/cm$^2$·sec and then the silicon molecular beams are irradiated upon the substrate for 30 minutes to carry out the cleaning treatment of the substrate of the substrate. Subsequently, the Rutherford Backscattering Spectrum (RBS) is taken for each of said intensity conditions A, B, C, D, E during the growth of the silicon film. As a result, a relation between the intensity of silicon molecular beams and a ratio of a peak level of the aligned spectrum to a peak level of the random spectrum in percentage x (%) shown in FIG. 7 has been obtained. A, B, C, D, E in FIGS. 6, 7 correspond to data points of the intensity conditions, and a curve in FIG. 6 is a theoretical limiting curve showing the relationship between the intensity of silicon molecular beams capble of carrying out the cleaning treatment and the substrate temperature.

Figure 7:
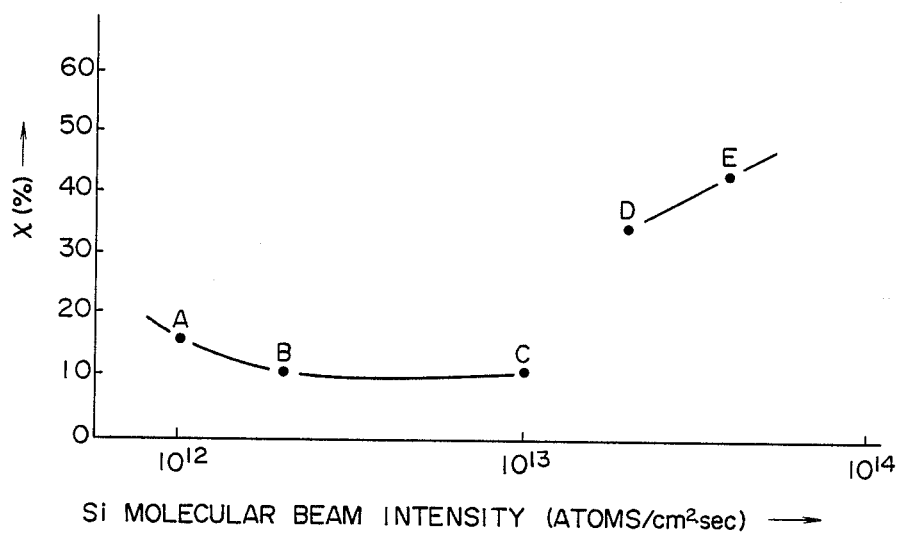
FIG. 7 is a graph showing a relation between the Si molecular beam intensity and a peak level ration x of a Rutherford backscattering spectrum under the conditions shown in FIG. 6.

And, as shown in FIG. 7, in the case where the intensity of silicon molecular beams are A, B, C, the peak level ration x has very lower values to an extent of 15 to 10% and the growing silicon film is superior incrystallinity but in the case where the intensity of silicon molecular beams is high to an extent of D and E, the peak level ratio x is rapidly increased to 40 to 50% and the crystallinity of the silicon film becomes inferior to that in the case where the intensity of silicon molecular beams is A, B, C.

Besides, although not shown in FIG. 7, it is also found from a SEM photograph taken at the same time as this measurement that when the intensity of silicon molecular beams becomes higher than $2 \times 10^{13}$ atoms/cm²·sec in the case D, the accumulation of silicon makes progress more predominantly than the etching reaction on the surface of the substrate, whereby the contaminants, such as oxygen and carbon, are taken into the growing silicon film to lower the crystallinity of the silicon film and generate an unevenness on the surface of the silicon film.

Accordingly, the optimum intensity of silicon molecular beams required for the cleaning treatment of the substrate is $1 \times 10^{12}$ to $1 \times 10^{13}$ atoms/cm²·sec.

Figure 8:
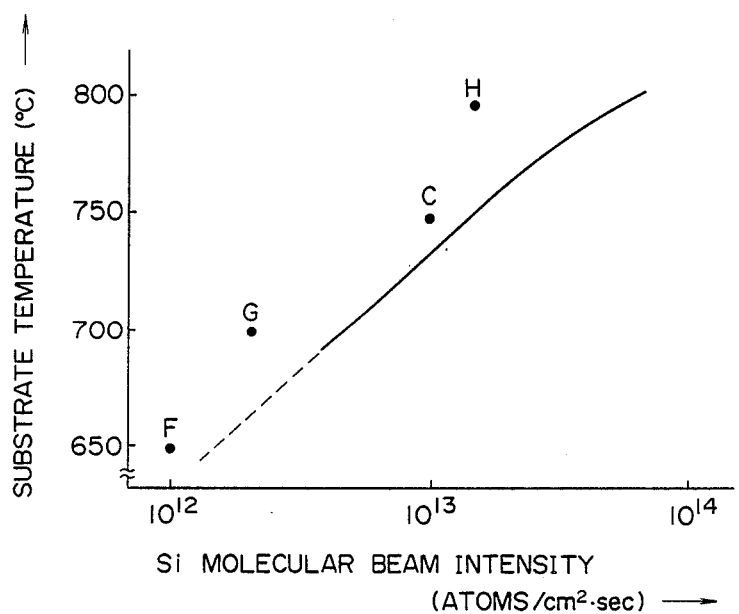
FIG. 8 is a graph showing a relation between the Si molecular beam intensity and the substrate temperature.
Figure 9:
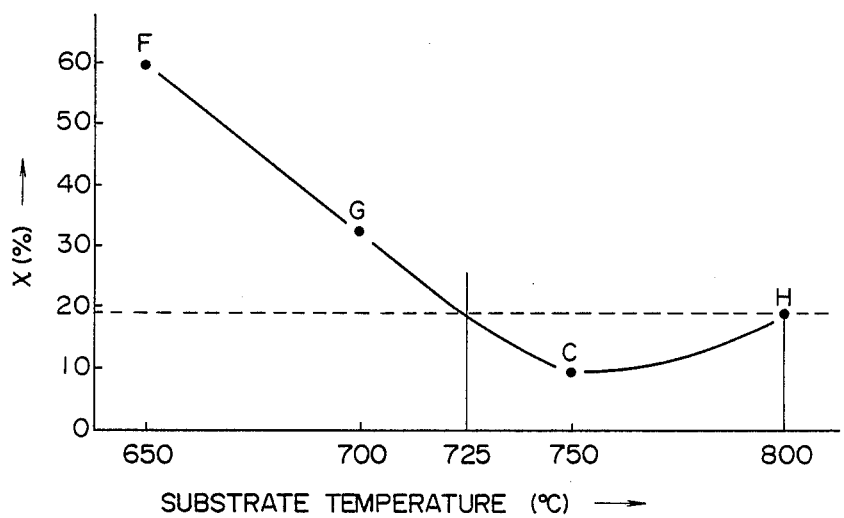
FIG. 9 is a graph showing a relation between the substrate temperature and the peak level ratio x of the Rutherford backscattering spectrum.

Next, in order to investigate the optimum substrate temperature, as shown in FIG. 8, the combined condition of the substrate temperature and the intensity of silicon molecular beams is set as follows:

F: 650° C., $1 \times 10^{12}$ atoms/cm²·sec
G: 700° C., $2 \times 10^{12}$ atoms/cm²·sec
C: 750° C., $1 \times 10^{13}$ atoms/cm²·sec
H: 800° C., $2 \times 10^{13}$ atoms/cm²·sec and then the surface of the substrate is subjected to the cleaning treatment. Subsequently, the RBS is measured for each of the combined conditions F, G, C, H during the growth of the silicon film. The obtained relation between the substrate temperature and the peak level ratio x (%) is shown in FIG. 9. F, G, C, H in FIGS. 8, 9 correspond to the data points of the combined conditions and a curve in FIG. 8 is also a theoretical limiting curve as in the case shown in FIG. 6.

It is found from FIG. 9 that in the case where the substrate temperature is 650° C. (the case F), the peak level ratio x is high to an extent of 60% and the crystallinity is not superior but in the case where the substrate temperature is 750° C. (the case C), the peak level ratio x is remarkably reduced to an extent of about 10% and the growing silicon film is superior in crystallinity. When the substrate temperature is further risen up to 800° C. (the case H), the peak level ratio x approached 20% and the crystallinity of the growing silicon film is slightly inferior to the peak level ratio of 10% at the substrate temperature of 750° C. but it can be said that the single crystals having such an extent of level ratio have characteristics sufficient for the formation of a semiconductor device.

Besides, although not shown in the drawing, it is also obvious from the SEM photograph taken at the same time that in the case F, the surface of the silicon film becomes uneven and rough while in the cases G, C, H, the surface of the silicon film becomes flat. It is far this reason that in the case where the substrate temperature is 650° C., the relation as expressed by aforesaid equation is remarkably difficult to make progress of even though the reaction as expressed by the equation makes progress, the reaction products SiO and Al are difficult to vaporize from the surface of the substrate and the surface of the substrate can not be sufficiently cleaned, thereby reducing the crystallinity of the silicon film and leading to an unevenness of the surface.

In addition, another sample is subjected to the cleaning treatment at the substrate temperature of 900° C. under the conditions within a range left and over aforesaid limiting curve by irradiating silicon molecular beams upon it. The peak level ratio x is determined and the SEM photograph is taken and about the same results is obtained as in the case G.

Putting the conditions for cleaning the substrate in order on the basis of the above described, it is necessary to set the substrate temperature at 700° to 900° C., preferably 725° to 800° C. at which the peak level ratio x is less than 20%, more preferably 725° to 775° C. In addition, it can be said on the basis of FIG. 9 that the optimum substrate temperature is 750° C. AT this time, the intensity of silicon molecular beams becomes $1 \times 10^{12}$ to $1 \times 10^{13}$ atoms/cm²·sec and if the conditions are not within this range where hatching is drawn, the growing silicon film is inferior in crystallinity.

Figure 10:
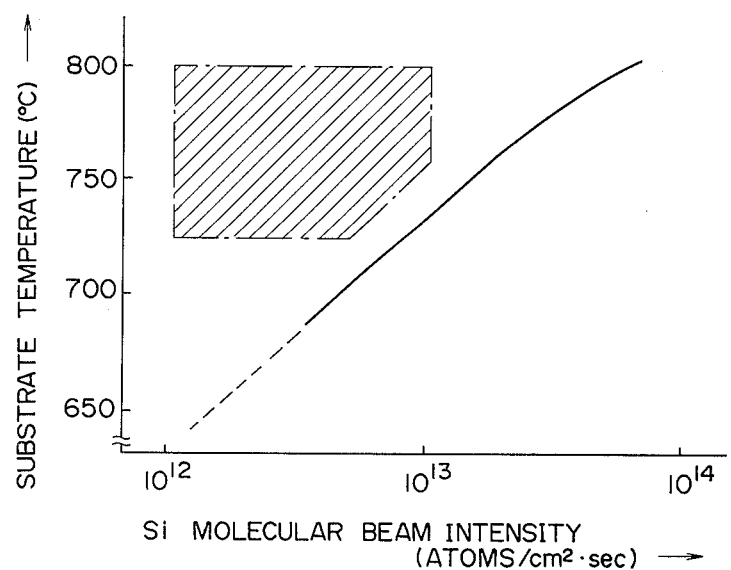
FIG. 10 is a graph showing preferable combination conditions of the Si molecular beam intensity and the substrate temperature.

FIG. 10 is a graph showing the preferable range of the substrate temperature and the intensity of silicon molecular beams by the hatched area, in which a curve is also a theoretical limiting curve as in the cases shown in FIGS. 6, 8. the accumulation of silicon makes progress more predominantly than the etching reaction of the sapphire substrate in a right side range of this theoretical limiting curve. Accordingly, when the surface of the substrate is subjected to the cleaning treatment under the conditions shown within the range, where hatching is drawn, in FIG. 10 and then the single crystalline silicon film is formed on the cleaned surface of the substrate by the MBE method under the conditions shown within the right side range of the curve in FIG. 10, with the SOS structure shown in FIG. 1(d) being obtained.

In addition, as to the pressure, although the pressure of $1 \times 10^{-11}$ Torr is used in the above described preferred embodiment, the degree of vacuum higher than $1 \times 10^{-8}$ Torr is sufficient.

Next, a preferred embodiment, in which the single crystalline sapphire substrate is replaced by a spinel film which is a single crystalline insulating film, is described.

Figure 11:
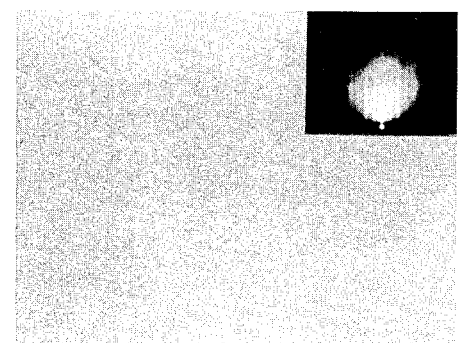
FIG. 11 is an electron microscopic photograph and a RHEED pattern photograph of the surface of the silicon film formed on a spinel film.

Since the single crystalline spinel fim ($MgO.Al_2O_3$) is similar to sapphire ($Al_2O_3$) in composition, the reaction as expressed by the above described equation makes progress also on the surface of the spinel film. The surface of the spinel film has been subjected to the cleaning treatment under the optimum conditions in the preceding preferred embodiment of the sapphire substrate, that is to say at the substrate temperature of 750° C. and the intensity of silicon molecular beams of $1 \times 10^{13}$ atoms/cm²·sec, and then the silicon film has been grown on the cleaned spinel film by the MBE method. The surface state of the resulting silicon film is shown at an electron microscopic photograph (FIG. 11). The RHEED pattern of this silicon film is shown in an upper right portion of FIG. 11.

It is obvious from FIG. 11 that the silicon film grown on the surface of the single crystalline spinel film cleaned by irradiating silicon molecular beam thereon shows an even surface in the same manner as in the case of the sapphire substrate and the silicon film showing a streaky RHEED pattern and superior in crystallinity is grown.

Figure 12:
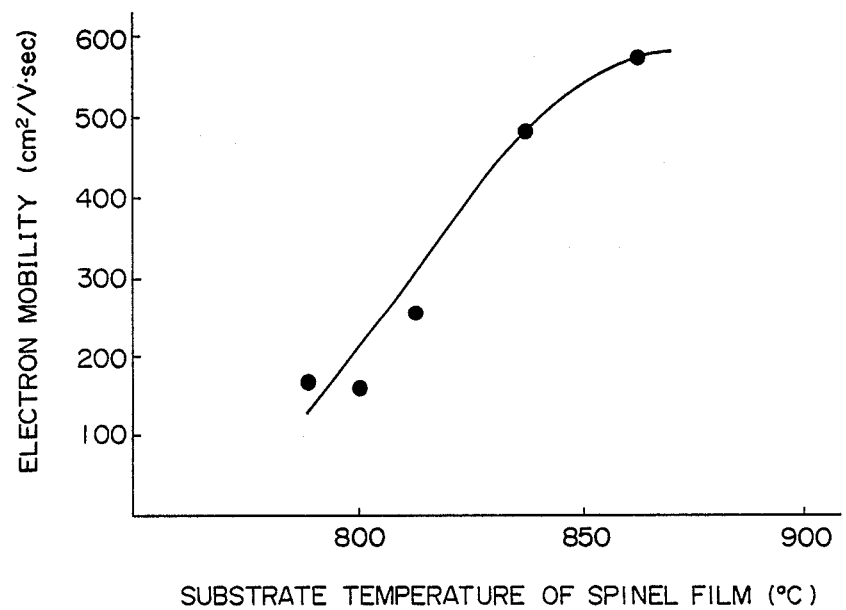
FIG. 12 is a diagram showing a relation between a temperature of the spinel single crystalline film and an electron mobility.

FIG. 12 shows an electron mobility of a SOSp (Silicon on Spinel) film grown on the surface of the single crystalline spinel film, which has been cleaned under the conditions that the substrate temperature is 750° C. and the intensity of silicon molecular beams is $1 \times 10^{13}$ atoms/cm²·sec, by the MBE method at various temperatures. At this time, the silicon film of n-type having a carrier concentration of $5 \times 10^{14}$/cm³ and a film thickness of 3.6 μm is obtained. The electron mobility is heightened with a rise of temperature, amounting to about 580 cm²/V·sec at 860° C. This is nearly equal to an electron mobility of about 550 cm²/V·sec for a SOS film grown by the CVD method an having a carrier concentration of $5 \times 10^{14}$/cm³ and a film thickness of 1 μm, so that it can be supposed that a SOSp film having nearly the same extent of film quality as a SOS film is obtained.

As obvious from the above description, according to a method of producing a semiconductor thin film of the present invention, the surface of single crystalline insulating substances, such as a sapphire substrate and a spinel film, can be cleaned by irradiating silicon molecular beams thereon in a superhigh vacuum at lower temperature ranging from 700° to 900° C., so that the conventional occurrence of a warp and defects of the single molecular insulating substances due to the heating thereof to 1,000° C. or more can be prevented, the lowering of the degree of vacuum due to the irradiation of vapor from a growing chamber wall and the like and the recontamination of the cleaned surface of the single crystalline insulating substances being prevented, and also the measures for improving the heat-resistance of jigs for the single crystalline insulating substances being not required, thereby being capable of uniformly growing of the high-quality single crystalline silicon film superior in crystallinity by the use of a simple and inexpensive apparatus. The effects are remarkably great.

Besides, it is necessary for the continuous cleaning of the surface of the single crystalline insulating substances and epitaxial growth of the single crystalline silicon film on the single crystalline insulating substances in the same growing chamber of the MBE apparatus only to change the intensity of silicon molecular beams under the conditions that a superhigh degree of vacuum is kept in the growing chamber and simultaneously, the substrate temperature is kept constant within a range from 700° to 900° C., so that the process of production of the SOS structure can be simplified, thereby remarkably shortening the time required for the producing.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A method for producing a semiconductor thin film, in which a single crystalline silicon film is grown on a single crystalline sapphire substrate by the molecular beam epitaxy method in a superhigh vacuum growing chamber, which comprises:

a first step which comprises cleaning a surface of said single crystalline sapphire substrate by irradiating silicon molecular beams thereon under the condition wherein said single crystalline insulating substance is kept at temperatures of 700° to 900° C., and a second step which comprises growing the single crystalline silicon film by increasing intensity of silicon molecular beams compared to that in said first step.

2. The method for producing a semiconductor thin film as set forth in claim 1, in which degree of vacuum of said superhigh vacuum growing chamber is higher than $1 \times 10^{-8}$ Torr.

3. The method for producing a semiconductor thin film as set forth in claim 1, in which said temperature, at which said single crystalline sapphire substrate is to be kept, is 725° to 800° C.

4. The method for producing a semiconductor thin film as set forth in claim 3, in which said temperature, at which said single crystalline sapphire substrate is to be kept, is 725° to 775° C.

5. The method for producing a semiconductor thin film as set forth in claim 1, in which said intensity of said silicon molecular beams is $1 \times 10^{12}$ to $1 \times 10^{13}$ atoms/cm²·sec.

* * * * *